United States Patent [19]
Ishida

[11] Patent Number: 6,003,141
[45] Date of Patent: Dec. 14, 1999

[54] SINGLE CHIP PROCESSOR WITH EXTERNALLY EXECUTED TEST FUNCTION

[75] Inventor: Ryuji Ishida, Tokyo, Japan

[73] Assignee: NEC Corporation, Tokyo, Japan

[21] Appl. No.: 08/705,830

[22] Filed: Aug. 30, 1996

[30] Foreign Application Priority Data

Aug. 30, 1995 [JP] Japan .................................. 7-220959

[51] Int. Cl.⁶ ................................................. G06F 11/00
[52] U.S. Cl. .............................................................. 714/30
[58] Field of Search ...................... 395/183.06, 182.04, 395/183.18, 562, 595; 324/765

[56] References Cited

U.S. PATENT DOCUMENTS

| | | | |
|---|---|---|---|
| 4,041,467 | 8/1977 | Cota et al. ............................... | 364/900 |
| 4,217,638 | 8/1980 | Namimoto et al. ...................... | 364/200 |
| 4,672,534 | 6/1987 | Kamiya ................................. | 395/183.06 |
| 5,045,992 | 9/1991 | Yates, Jr. et al. ........................ | 364/200 |
| 5,201,056 | 4/1993 | Daniel et al. ............................ | 395/800 |
| 5,202,978 | 4/1993 | Nozuyama ................................ | 714/30 |
| 5,680,600 | 10/1997 | Childers et al. ......................... | 395/800 |

FOREIGN PATENT DOCUMENTS

| | | |
|---|---|---|
| 2238496 | 8/1972 | Germany . |
| 1-84549 | 7/1989 | Japan . |
| 2-12436 | 1/1990 | Japan . |
| 2259938 | 10/1990 | Japan . |
| 3217988 | 9/1991 | Japan . |
| 4317140 | 11/1992 | Japan . |
| 1437217 | 5/1976 | United Kingdom . |

*Primary Examiner*—Robert W. Beausoliel, Jr.
*Assistant Examiner*—Pierre E. Elisca
*Attorney, Agent, or Firm*—Sughrue, Mion, Zinn, Macpeak & Seas, PLLC

[57] ABSTRACT

In a single chip processor including an instruction ROM and a decoder for decoding instruction codes from the instruction ROM. During usual operation a multiplexer selects supplying instruction codes from the instruction ROM to the decoder. Alternatively, test instruction codes are input from an input interface via the multiplexer to the decoder in a test mode.

6 Claims, 3 Drawing Sheets

SINGLE CHIP PROCESSOR WITH EXTERNALLY EXECUTED TEST FUNCTION

BACKGROUND OF THE INVENTION

1. Field of the Invention

The present invention relates to a single chip processor, and more particularly, to an improvement of a test function of the single chip processor.

2. Description of the Related Art

In a single chip processor, in order to realize a high speed operation, Harvard architecture has been adopted to isolate a data path for instruction codes from a data path for operational data. Particularly in a digital signal processor, an external instruction read-only memory (ROM) or an external instruction random access memory (RAM) is not preferable in view of the access speed and the number of external pins. Therefore, an instruction ROM (or RAM) is incorporated into the single chip processor. In addition, a test program for testing internal circuits has to be incorporated into the instruction memory. As a result, a user processing program area in the instruction memory is reduced in size.

Particularly, since one instruction is formed by a plurality of control fields; in a digital signal processor (DSP) having horizontal type instruction codes, the instructions are very complex. Therefore, it is actually impossible to store all the test programs in the instruction memory. In addition, it is impossible to verify other events which are not included in the test program stored in the instruction memory. Further, it is difficult to verify the operation of the internal circuits after shipping.

In another prior art single chip processor (See JP-A-2-12436), a test program is written into a RAM and a testing operation is, in turn, carried out in accordance with the test program stored in the RAM. In this processor, however, two read operations are carried out for every instruction cycle, thus the test speed is very low. Note that only one read operation is carried out for an instruction cycle of the processor.

SUMMARY OF THE INVENTION

It is an object of the present invention to provide a single chip processor having a user processing program area which is not limited by stored testing instructions.

According to the present invention, test instruction codes are input from an input interface via a multiplexer to a decoder in a test mode contained in a single chip processor including an instruction ROM and the decoder which decodes instruction codes from the instruction ROM.

Also, test instruction codes are stored in a data RAM in advance. The test instruction codes are then read out of the data RAM in accordance with the content of a program counter via another multiplexer.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENTS

Before describing the preferred embodiments, a prior art single chip microprocessor will be explained with reference to FIG. 1.

Figure 1:
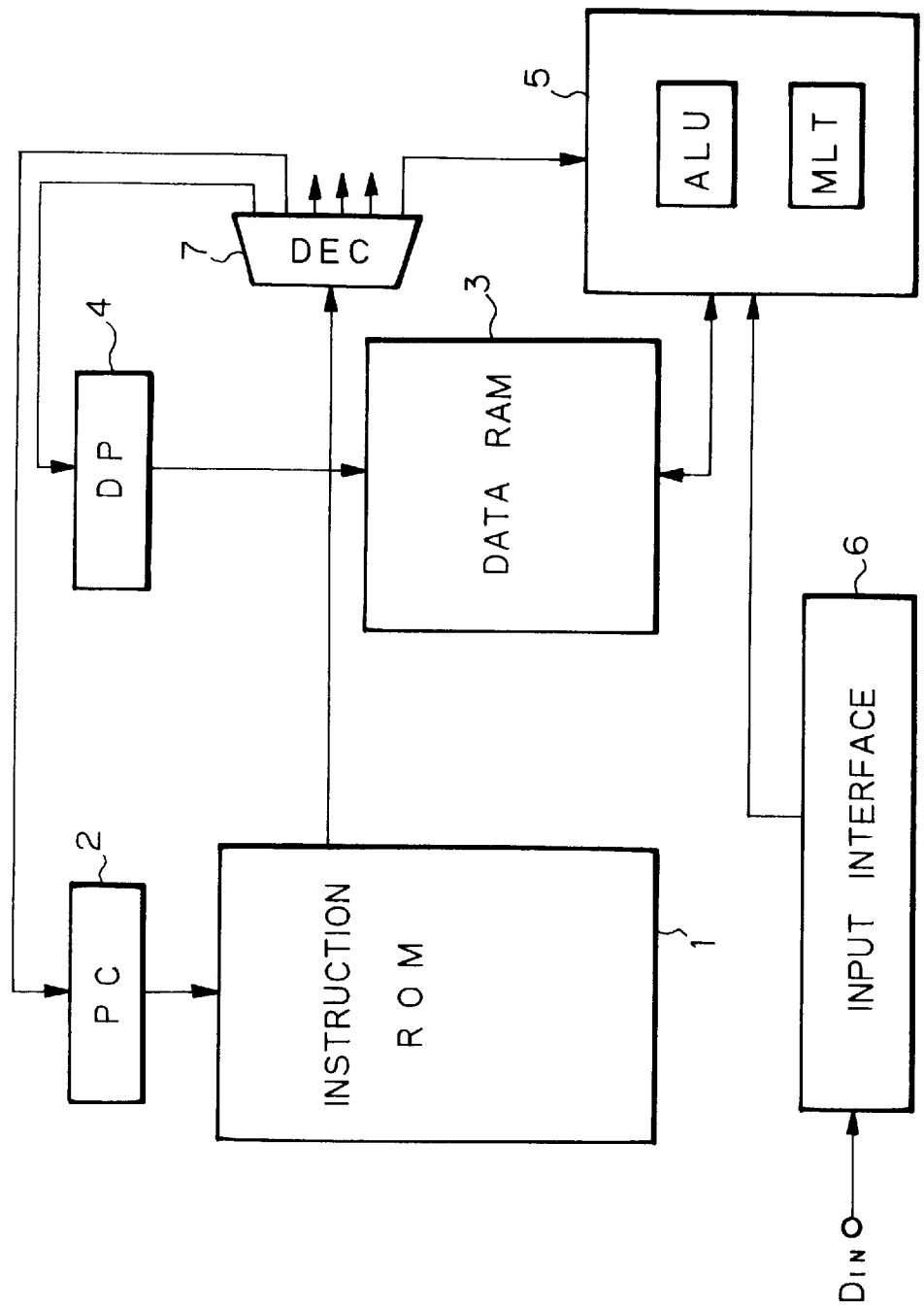
FIG. 1 is a block circuit diagram illustrating a prior art single chip processor.

In FIG. 1, reference numeral 1 designates an instruction ROM which has an associated program counter 2. Also, reference numeral 3 designates a data RAM which has an associated data pointer 4. Further, reference numeral 5 designates an internal operational circuit including an arithmetic and logic unit (ALU), and a multiplier (MLT). The internal operational circuit 5 is connected to the data RAM 3 and an input interface 6 which is, in turn, connected to a data input terminal $D_{IN}$.

Also, instructions read out of the instruction ROM 1 are supplied to a decoder 7, and as a result, the decoder 7 controls the program counter 2, the data pointer 4, and the internal operational circuit 5.

Particularly, in an application specific integrated circuit (ASIC) single processor, the instructions are stored only in the instruction ROM 1 to reduce the chip area. In the single chip processor of FIG. 1, however, a test program for testing the internal operational circuit 5 has to be incorporated into the instruction ROM 1. As a result, a user processing program area is reduced in the instruction ROM 1.

Particularly, since one instruction is formed by a plurality of control fields, in a DSP processor having horizontal type instruction codes, the instructions are very complex. Therefore, it is actually impossible to store all the test programs in the instruction ROM 1. In addition, it is impossible to verify other events which are not included in the test program stored in the instruction ROM 1. Further, it is difficult to verify the operation of the internal operational circuit 5 after shipping.

Figure 2:
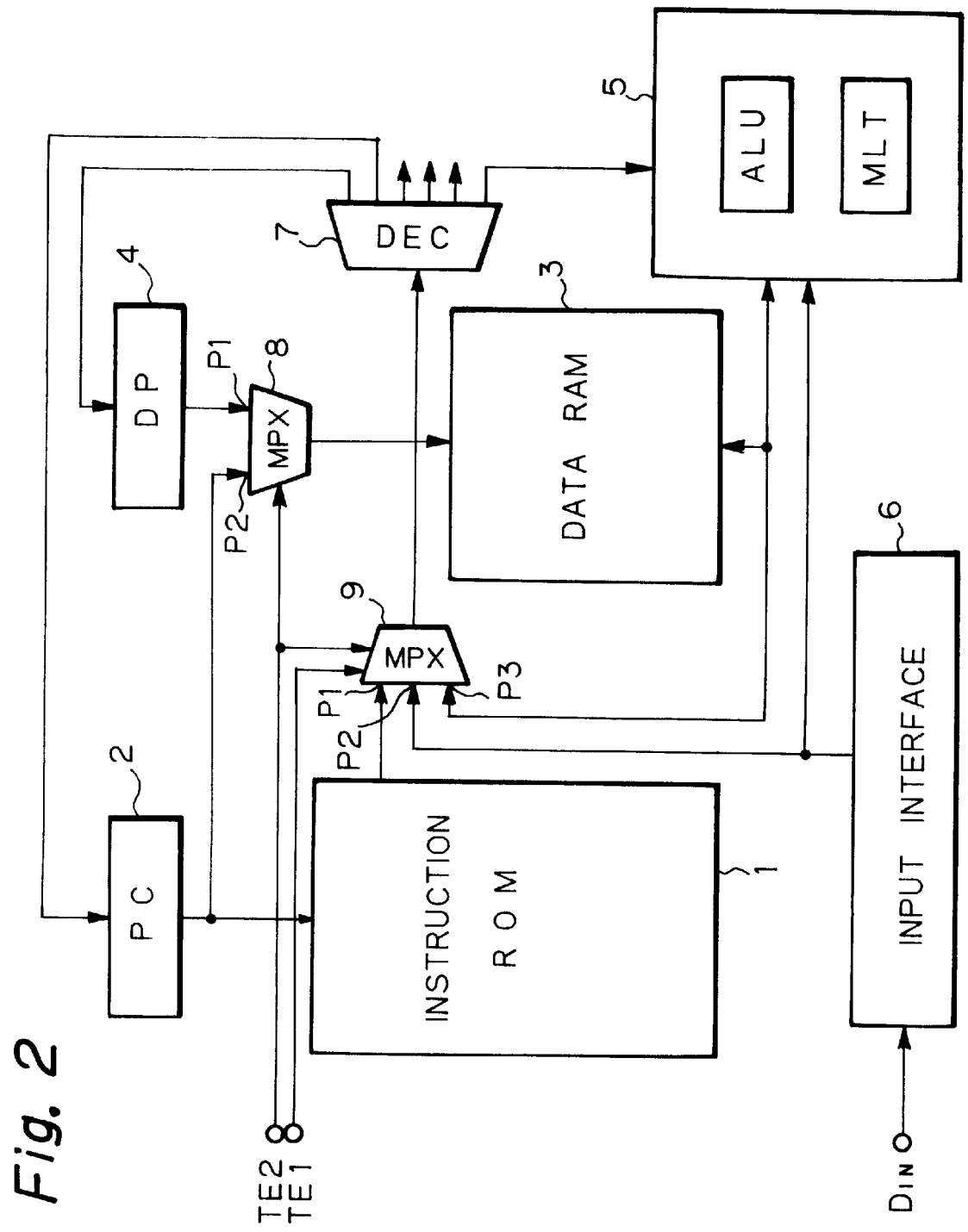
FIG. 2 is a block circuit diagram illustrating a first embodiment of the single chip processor according to the present invention.

FIG. 2 illustrates a first embodiment of the present invention, wherein multiplexers 8 and 9 controlled by voltages at test mode terminals TE1 and TE2 are added to the elements of FIG. 1.

The multiplexer 8 selects one of the outputs of the program counter 2 and the data pointer 4 and transmits it to the data RAM 3. Also, the multiplexer 9 selects one of the outputs of the instruction ROM 1, the input interface 6 and the data RAM 3, and transmits it to the decoder 7. Note that the test mode terminals TE1 and TE2 have the following relationship to the operations of the 10 multiplexers 8 and 9:

|  | TE1 | TE2 | MPX8 | MPX9 |
| --- | --- | --- | --- | --- |
| USUAL MODE | "0" | "0" | P1 | P1 |
| INSTRUCTION TEST MODE | "1" | "40" | P1 | P2 |
| RAM TEST MODE | "1" | "11" | P2 | P3 |

In the usual operation mode (TE1=TE2="0"), the output data of the data pointer 4 is transmitted via the multiplexer 8 to the data RAM 3. Also, the output data of the instruction ROM 1 is transmitted via the multiplexer 9 to the decoder 7. Therefore, the content of the program counter 2 is renewed in each instruction execution cycle, so that an instruction code is read out of the instruction ROM 1. Thus, the processor of FIG. 2 is operated in accordance with the instruction codes stored in the instruction ROM 1 in the same way as in the processor of FIG. 1.

In the above-mentioned usual operation mode, data is input from the data input terminal $D_{IN}$ via the input interface 6 to the internal operational circuit 5, and data is output from the internal operational circuit 5 to a data output terminal (not shown). In addition, data is written from the internal operational circuit 5 into the data RAM 3, or data is read from the data RAM 3 to the internal operational circuit 5 in accordance with the content of the data pointer 4.

In the instruction test mode (TE1="1" and TE2="0"), the output data of the data pointer 4 is transmitted via the multiplexer 8 to the data RAM 3. On the other hand, the output data of the input interface 6 is transmitted via the multiplexer 9 to the decoder 7. Therefore, when an arbitrary test instruction code is input from the data input terminal $D_{IN}$ to the input interface 6, the processor of FIG. 2 is operated in accordance with the test instruction code, thus making it possible to verify all the possible operations.

Even in the above-mentioned instruction test mode, the operation of the internal operational circuit 5 and the write/read operations of the data RAM 3 are carried out in the same way as in the usual operation mode. Note that although it is impossible to take in usual data from input interface 6, it is possible to treat the test instruction codes as data.

In the RAM test mode (TE1="1" and TE2="1"), the output data of the program counter 2 is transmitted via the multiplexer 8 to the data RAM 3. On the other hand, the output data of the data RAM 3 is transmitted via the multiplexer 9 to the decoder 7. In this case, a series of test instruction codes are stored from the data input terminal $D_{IN}$ by the internal operational circuit 5 in advance. If the content of the program counter 2 is renewed in each instruction execution cycle as in the usual operation mode, the test instruction codes are read out of the data RAM 3 in accordance with the content of the program counter 2. Thus, the processor of FIG. 2 also can verify all the possible operations.

In the above-mentioned RAM test mode, the operation of the data pointer 4 is invalid, and as a result, it is impossible to access usual data of the data RAM 3. However, the instruction code stored in the data RAM 3 can be treated as usual data and can be output to the internal operational circuit 5.

Figure 3:
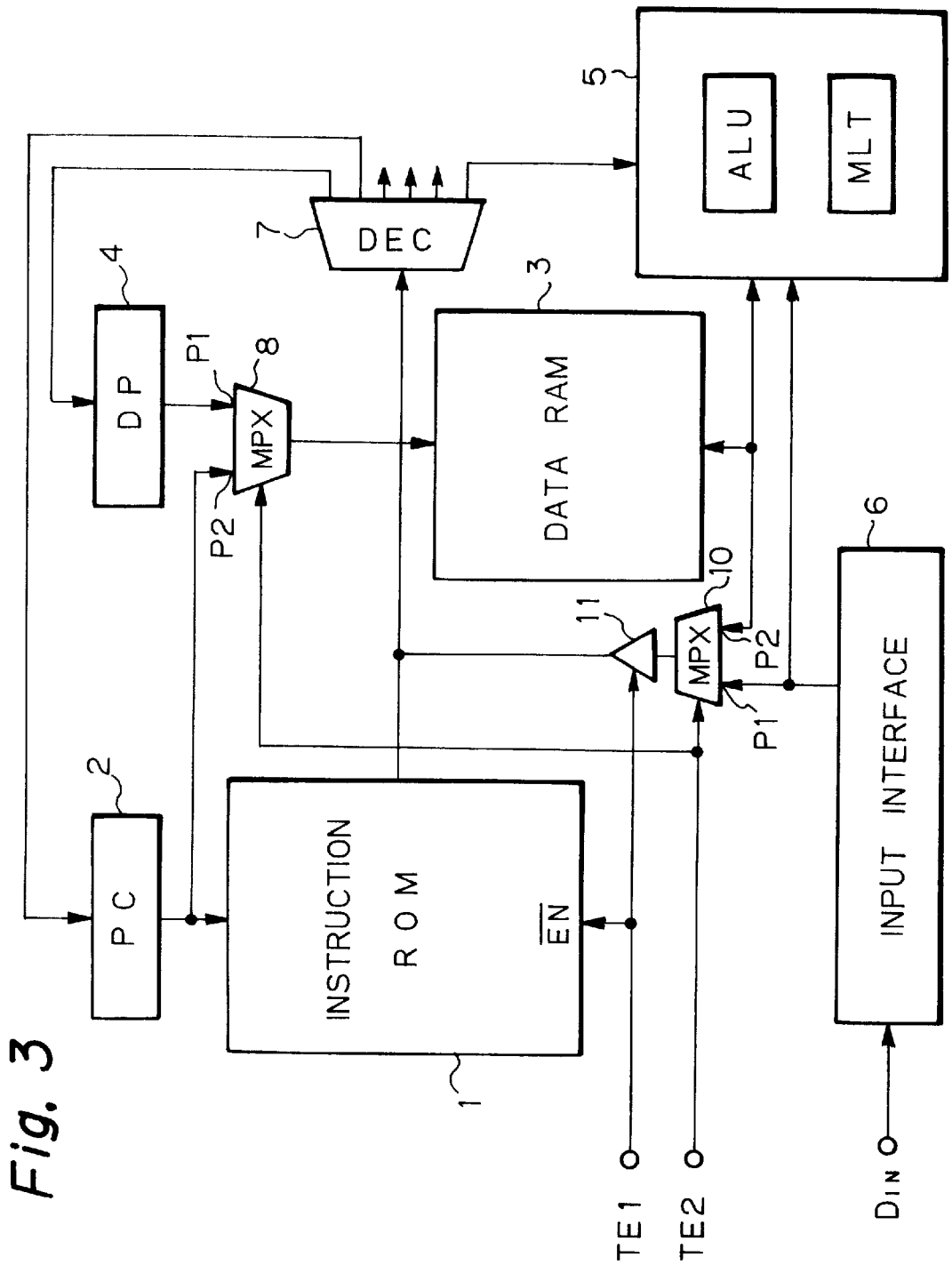
FIG. 3 is a block circuit diagram illustrating a second embodiment of the single chip processor according to the present invention.

In FIG. 3, which illustrates a second embodiment of the present invention, a multiplexer 10 and a tri-state buffer 11 are provided instead of the multiplexer 9 of FIG. 2. That is, the input of decoder 7 is connected to the instruction ROM 1 and the tri-state buffer 11. In this case, when the tri-state buffer 11 is put in a high impedance state by the voltage at the test mode terminal TE1, the instruction ROM 1 is enabled by the voltage at the test mode terminal TE1. On the other hand, when the tri-state buffer 11 is put in a through state by the voltage at the test mode terminal TE1, the instruction ROM 1 is disabled by the voltage at the test mode terminal TE1. Also, the multiplexer 10 selects one of the outputs of the input interface 6 and the data RAM 3 and transmits it via the tri-state buffer 11 to the decoder 7. Note that the test mode terminals TE1 and TE2 have the following relationship to the operations of the instruction ROM 1, the multiplexers 8 and 10 and the tri-state buffer 11:

| | TE1 | TE2 | MPX8 | MPX10 | ROM1 | BUF11 |
|---|---|---|---|---|---|---|
| USUAL MODE | "0" | "0" | P1 | P1 | ENABLED | HZ |
| INSTRUCTION TEST MODE | "1" | "0" | P1 | P1 | DISABLED | THROUGH |
| RAM TEST MODE | "1" | "1" | P2 | P2 | DISABLED | THROUGH |

In the usual operation mode (TE1=TE2="0"), the output data of the data pointer 4 is transmitted via the multiplexer 8 to the data RAM 3. Also, since the tri-state buffer 11 is in a high impedance state, the output data of the instruction ROM 1 which is enabled is transmitted to the decoder 7. Therefore, the content of the program counter 2 is renewed in each instruction execution cycle, so that an instruction code is read out of the instruction ROM 1. Thus, the processor of FIG. 3 is operated in accordance with the instruction codes stored in the instruction ROM 1 in the same way as the processor of FIG. 1.

In the above-mentioned usual operation mode, in the same way as in FIG. 2, data is input from the data input terminal $D_{IN}$ to the internal operational circuit 5, and data is output from the internal operational circuit 5 to a data output terminal (not shown). In addition, data is written from the internal operational circuit 5 into the data RAM 3, or data is read from the data RAM 3 to the internal operational circuit 5 in accordance with the content of the data pointer 4.

In the instruction test mode (TE1="1" and TE2="0"), the output data of the data pointer 4 is transmitted via the multiplexer 8 to the data RAM 3. On the other hand, since the instruction ROM 1 is disabled and the tri-state buffer 11 is in a through state, the output data of the input interface 6 is transmitted via the multiplexer 10 to the decoder 7 in response to the voltage at the test mode terminal TE2. Therefore, when an arbitrary test instruction code is input from the data input terminal DI to the input interface 6, the processor of FIG. 3 is operated in accordance with the test instruction code, thus verifying all the possible operations.

Even in the above-mentioned instruction test mode, the operation of the internal operational circuit 5 and the write/read operations of the data RAM 3 are carried out in the same way as in the usual operation mode. Note that although it is impossible to take in usual data from input interface 6, it is possible to treat the test instruction codes as data.

In the RAM test mode (TE1="1" and TE2="1"), the output data of the program counter 2 is transmitted via the multiplexer 8 to the data RAM 3. On the other hand, since the instruction ROM 1 is disabled and the tri-state buffer 11 is in a through state, the output data of the data RAM 3 is transmitted via the multiplexer 10 to the decoder 7 in response to the voltage at the test mode terminal TE2. In this case, a series of test instruction codes are stored from the data input terminal $D_{IN}$ via the internal operational circuit 5 in advance. Then, if the content of the program counter 2 is renewed in each instruction execution cycle as in the usual operation mode, the test instruction codes are read out of the data RAM 3 in accordance with the content of the program counter 2. Thus, the processor of FIG. 3 also can verify all the possible operations.

Even in the above-mentioned RAM test mode, the operation of the data pointer 4 is invalid, and as a result, it is impossible to access usual data of the data RAM 3. However, the instruction code stored in the data RAM 3 can be treated as usual data and can be output to the internal operational circuit 5.

In FIG. 3, since the instruction ROM 1 is disabled in a test mode (TE1="1"), the power dissipation can reduced as compared with the processor of FIG. 2.

As explained hereinabove, according to the present invention, since it is unnecessary to store a test program in the instruction ROM, a user program area can be increased in the instruction ROM. Also, it is possible to verify all the possible tests for horizontal type instructions for a DSP or the like. Further, even after shipping, it is possible to carry out test programs.

I claim:

1. A single chip processor comprising:
   an instruction storing means for storing instruction codes;
   a first addressing means for indicating an address of said instruction storing means;
   a data inputting means for inputting test instruction codes;
   a decoder means; and
   a first selector means, connected between said instruction storing means, said data inputting means and said decoder means,
   said first selector means selecting and supplying the instruction codes of said instruction storing means to said decoder in a usual mode, and
   said first selector means selecting and supplying the test instruction codes of said data inputting means to said decoder in a first test mode.

2. The processor as set forth in claim 1, further comprising:
   a data storing means for storing data;
   a second addressing means for indicating an address of said data storing means; and
   a second selector means connected between said first and second addressing means and said data storing means,
   said first selector means further being connected to said data storing means,
   said first selector means selecting and supplying output data of said data storing means to said decoder in a second test mode,
   said second selector means selecting and supplying the address of said second addressing means to said data storing means in said usual mode and in said first test mode, and
   said second selector means selecting and supplying the address of said first addressing means to said data storing means in said second test mode.

3. The processor as set forth in claim 2, wherein test instruction codes are stored in said data storing means before said second test mode.

4. A single chip processor comprising:
   a first test mode terminal;
   an instruction ROM for storing instruction codes;
   a program counter, connected to said instruction ROM, for generating a first address;
   a data input interface for test instruction codes;
   a decoder; and
   a first multiplexer, connected between said instruction ROM, said data input interface and said decoder, said first multiplexer being controlled by a voltage at said first test mode terminal;
   said first multiplexer connecting an output of said instruction ROM to said decoder when the voltage at said first test mode terminal is a first value, and
   said first multiplexer connecting an output of said data input interface to said decoder when the voltage at said first test mode terminal is a second value.

5. The processor as set forth in claim 4, further comprising:
   a second test mode terminal;
   a data RAM;
   a data pointer for generating a second address; and
   a second multiplexer, connected between said program counter, said data pointer and said data RAM, said second multiplexer being controlled by a voltage at said second test mode terminal;
   said first multiplexer being further connected to said data RAM and being further controlled by the voltage at said second test mode terminal,
   said first multiplexer connecting the output of said data input interface to said decoder when the voltage at said first test mode terminal is the second value, and the voltage at said second test mode terminal is a third value,
   said first multiplexer connecting an output of said data RAM to said decoder when the voltage at said first test mode terminal is the second value, and the voltage at said second test mode terminal is a fourth value,
   said second multiplexer supplying the second address of said data pointer to said data RAM when the voltage at said second test mode terminal is the third value, and
   said second multiplexer supplying the first address of said program counter to said data RAM when the voltage at said second test mode terminal is the fourth value.

6. A single chip processor comprising:
   first and second test mode terminals;
   an instruction ROM, connected to said first test mode terminal, for storing instruction codes, said instruction ROM being enabled when a voltage at said first test mode terminal is a first value and being disabled when the voltage at said first test mode terminal is a second value;
   a program counter, connected to said instruction ROM, for generating a first address,
   a data input interface for test instruction codes;
   a data RAM;
   a data pointer for generating a second address; and
   a decoder connected to said instruction ROM
   a first multiplexer, connected to said data input interface and said data RAM, said first multiplexer selecting an output of said data input interface when the voltage at said second test mode terminal is a third value and selecting an output of said data RAM when the voltage at said second test mode terminal is a fourth value;
   a tri-state buffer connected between said first multiplexer and said decoder, said tri-state buffer being in a high impedance state when the voltage at said first test mode terminal is the third value and being a through state when the voltage at said first test mode terminal is the fourth value; and
   a second multiplexer, connected between said program counter, said data pointer and said data RAM, said second multiplexer being controlled by the voltage at said second test mode terminal, said second multiplexer supplying the second address of said data pointer to said data RAM when the voltage at said second test mode terminal is the third value, said second multiplexer supplying the first address of said program counter to said data RAM when the voltage at said second test mode terminal is the fourth value.

* * * * *